United States Patent [19]
Kohchi et al.

[11] Patent Number: 5,783,842
[45] Date of Patent: Jul. 21, 1998

[54] SEMICONDUCTOR DEVICE HAVING AN INSULATING LAYER HAVING A CONCAVE SECTION FORMED BY OXIDIZING A SEMICONDUCTOR LAYER

[75] Inventors: Tetsunobu Kohchi, Hiratsuka; Mamoru Miyawaki, Isehara, both of Japan

[73] Assignee: Canon Kabushiki Kaisha, Tokyo, Japan

[21] Appl. No.: 803,499

[22] Filed: Feb. 20, 1997

Related U.S. Application Data

[63] Continuation of Ser. No. 631,889, Apr. 16, 1996, abandoned, which is a continuation of Ser. No. 181,260, Jan. 13, 1994, abandoned.

[30] Foreign Application Priority Data

Jan. 18, 1993 [JP] Japan ..................... 5-021639

[51] Int. Cl.$^6$ ..................................... H01L 29/04
[52] U.S. Cl. ................. 257/59; 257/72; 257/347; 349/42; 349/139
[58] Field of Search .................. 257/59, 72, 347; 359/54, 58, 59, 60; 349/41, 42, 139, 43, 143

[56] References Cited

U.S. PATENT DOCUMENTS

| | | | |
|---|---|---|---|
| 4,770,498 | 9/1988 | Aoki et al. | 359/59 |
| 4,869,576 | 9/1989 | Aoki et al. | 359/59 |
| 5,111,260 | 5/1992 | Malhi et al. | 257/59 |
| 5,153,702 | 10/1992 | Aoyama et al. | 359/59 |
| 5,245,452 | 9/1993 | Nakamura et al. | 359/59 |
| 5,341,028 | 8/1994 | Yamaguchi et al. | 257/344 |
| 5,378,919 | 1/1995 | Ochiai | 257/204 |

FOREIGN PATENT DOCUMENTS

| | | | |
|---|---|---|---|
| 0474474 | 3/1992 | European Pat. Off. | 359/59 |
| 1-129234 | 5/1989 | Japan | 359/59 |
| 4-115230 | 4/1992 | Japan | 359/54 |
| 4-115231 | 4/1992 | Japan | 359/59 |
| 4-133036 | 5/1992 | Japan | 359/58 |
| 4-180268 | 6/1992 | Japan | 257/59 |

OTHER PUBLICATIONS

Patent Abstracts of Japan, vol. 13, No. 57 (P-825), Feb. 9, 1989, & JP-A-63 246 728 (Ricoh), Oct. 13, 1988, Toru.
Patent Abstracts of Japan, vol. 15, No. 262 (P-1222), Jul. 3, 1991, & JP-A-03 085 530 (Sharp), Apr. 10, 1991, Makoto et. al.
Patent Abstracts of Japan, vol. 17, No. 122 (P-1501), Mar. 15, 1993, & JP-A-04 305 625 (Sony), Oct. 28, 1992, Takuo.

*Primary Examiner*—Minh-Loan Tran
*Attorney, Agent, or Firm*—Fitzpatrick, Cella, Harper & Scinto

[57] ABSTRACT

In a semiconductor device in which a passive element and an active element are formed on a substrate in which a thin film semiconductor layer is formed on an insulating layer or an insulating substrate, the device has a concave portion in at least a part of a portion below a wiring connecting the passive element or the active element.

5 Claims, 11 Drawing Sheets

SEMICONDUCTOR DEVICE HAVING AN INSULATING LAYER HAVING A CONCAVE SECTION FORMED BY OXIDIZING A SEMICONDUCTOR LAYER

This application is a continuation of application Ser. No. 08/631,889 filed Apr. 16, 1996, now abandoned, which is a continuation of application Ser. No. 08/181,260 filed Jan. 13, 1994, now abandoned.

BACKGROUND OF THE INVENTION

1. Field of the Invention

The present invention relates to a semiconductor device in which a passive element and an active element are provided on a semiconductor layer formed on an insulating layer or an insulating substrate. The invention also relates to a liquid crystal display apparatus in which a liquid crystal layer is sandwiched between a substrate on which the semiconductor device is formed and a transparent substrate.

2. Related Background Art

A semiconductor device in which a semiconductor layer is formed on an insulating layer or an insulating substrate and a passive element and an active element are formed on the surface of the semiconductor layer is generally called an SOI (Silicon on Insulate) device and attention is largely paid to such an SOI device because a high speed semiconductor device of a high integration degree can be realized for the following two reasons.

(1) In a transistor with an SOI structure, the circuit can be easily made fine, the current driving ability is high, and the transistor is excellent in high speed operation.

(2) A wiring is provided on the insulating substrate, a capacity is lighter than the conventional one, and high speed and a high integration degree can be realized.

To realize the high speed and high integration degree, a multi-layer wiring is indispensable, as shown in FIG. 11, a cross sectional view of a conventional semiconductor device. However, as shown by reference numeral 108, a height difference of the wiring portion is large and snapping of a wire in the height different portion and defective patterning of the wiring layer become problems. To solve those problems, a smoothing process is required after a wiring step. In FIG. 11, reference numeral 101 denotes an Si substrate; 102 an insulating layer (SiO$_2$); 103 a field oxide layer; 104 a poly silicon (Si) wiring; 105 an inter-layer insulating layer; 106 an Al wiring; and 107 an insulating layer.

When the smoothing process is executed, the following problems occur.

(1) Since a new step is added, the costs rise.

(2) Since a smoothed layer is provided, a distance between the wirings (in the thickness direction) (the ith wiring and the (i+1)th wiring (i=1, 2, . . . )) increases. A contact region between the lower wiring and the upper wiring increases. A chip size increases.

Further, the liquid crystal display apparatus has the following problems.

FIG. 12 shows a plan view of an array substrate of the conventional liquid crystal display apparatus. FIGS. 13A to 13D show cross sectional views of FIG. 12. FIG. 13A is a cross sectional view taken along the line A–A' in FIG. 12. FIG. 13B is a cross sectional view taken along the line B–B' in FIG. 12. FIG. 13C is a cross sectional view taken along the line C–C' in FIG. 12. FIG. 13D is a cross sectional view taken along the line D–D' in FIG. 12. In FIGS. 12 and 13A to 13D, reference numeral 111 denotes a data line; 112 an address line; 113 a pixel electrode; 114 a semiconductor layer; 117 an insulating layer; and 120 a substrate.

Hitherto, the surface of the array substrate has a structure of a large height difference (0.5 to 1.0 μsec) as shown in FIGS. 13A to 13C. Particularly, an intersection point between the data line 111 and the address line 112 shown in FIG. 13D indicates a portion which is most projected in the pixel. Therefore, at the time of rubbing, an orientation disturbance occurs at a position near the projecting portion, a white blank region in which a transmittance is not changed by the applied voltage occurs, and the contrast is deteriorated.

To solve the above problems, a method of light shielding the white blank region has been considered. However, according to this method, the brightness is reduced by only the amount of light shield, making this method unpreferable. Therefore, no effective means for solving the above problems is being used. Currently, film thicknesses of the data line 111 and address line 112 are made thin and the height difference is set to a value within an error range and the orientation variation caused by the height difference is substantially ignored.

SUMMARY OF THE INVENTION

It is an object of the invention to provide a semiconductor device and a liquid crystal display apparatus which can solve the problems as mentioned above.

Another object of the invention is to provide a semiconductor device having a flat surface which is accompanied with none of the enlargement of the chip size, increase in costs, disconnection of wires, and defective wiring pattern.

Still another object of the invention is to provide a semiconductor device in which a passive element and an active element are formed on a substrate in which a thin film semiconductor layer is formed on an insulating layer or an insulating substrate, wherein the device partially has at least a concave portion below a wiring connecting the passive element or the active element.

DETAILED DESCRIPTION OF THE PREFERRED EMBODIMENTS

According to an embodiment, in a semiconductor device in which a passive element and an active element are formed on a substrate in which a thin film semiconductor layer is formed on an insulating layer or an insulating substrate, by forming at least a partial concave portion under a wiring connecting the passive element or active element, the surface is flattened and the above problems are solved.

According to the embodiment, there is provided a liquid crystal display apparatus which is constructed by sandwiching a liquid crystal layer between an array substrate in which a plurality of pixel electrodes, each having a switch element and a capacitor element, are arranged at intersection positions of a first address line and a data line in a matrix form and a transparent opposite substrate on which a transparent electrode is formed, wherein the apparatus is characterized by having a concave portion in at least a part of the portion under wiring of at least one of the address line and the data line.

The embodiment also provides a method of manufacturing a liquid crystal display apparatus.

According to an embodiment, there is provided a method of manufacturing a liquid crystal display apparatus which is constructed by sandwiching a liquid crystal layer between an array substrate in which a plurality of pixel electrodes each having a switch element and a capacitor element are arranged at intersection positions of a first address line and a data line in a matrix form and a transparent opposite substrate on which a transparent electrode is formed, wherein the method is characterized by forming a concave portion in at least a part of the portion under a wiring of at least one of the address line and the data line.

According to the invention, a semiconductor device of a flat surface can be obtained without performing any special flattening process and it is possible to prevent the enlargement of the chip size, increase in costs, disconnection of wires, and defective wiring pattern.

Further, by using the array substrate on which the semiconductor device is formed, it is possible to realize a liquid crystal display apparatus in which an orientation variation upon rubbing is reduced, so that a white blank of a pixel portion is small, and a high contrast ratio is obtained.

EMBODIMENT 1

Figure 1:
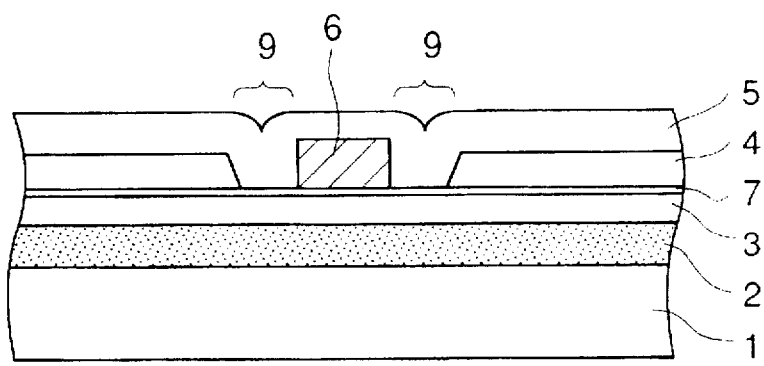
FIG. 1 is cross sectional view showing a semiconductor device of the first embodiment of the invention.
Figure 2A:
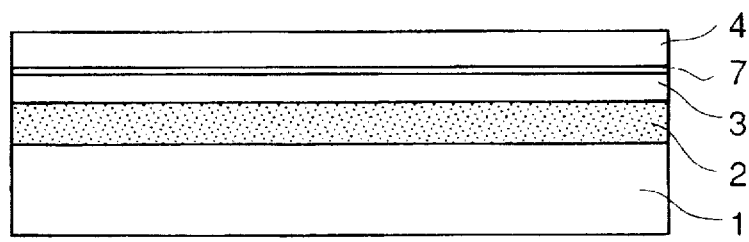
FIGS. 2A to 2C are diagrams showing a method of manufacturing the semiconductor device of FIG. 1.
Figure 2B:
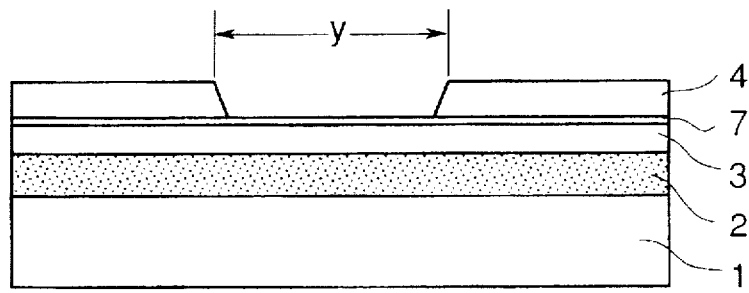
Figure 2C:
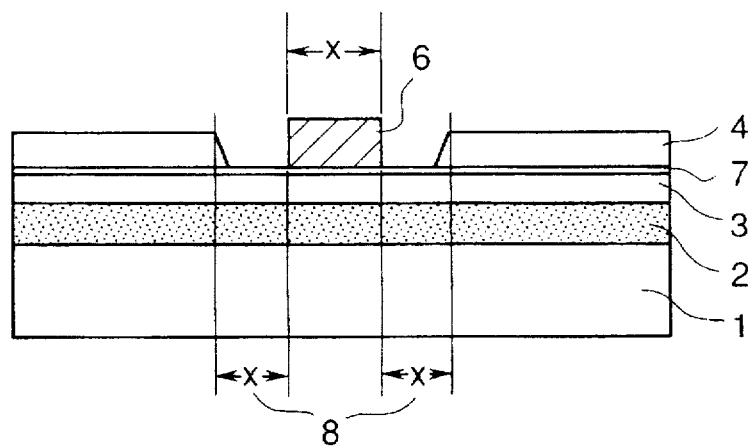

FIG. 1 shows the first embodiment of the invention. FIGS. 2A to 2C show a method of manufacturing of an apparatus of FIG. 1. In FIGS. 1 and 2A to 2C, reference numeral 1 denotes a semiconductor substrate such as Si, GaAs, or the like or an insulating substrate such as glass, sapphire, or the like; 2 an insulating layer of, for example, $SiO_2$, SiN, or an SiON layer as a compound thereof, or the like; 3 a first insulating layer; 7 a second insulating layer; 4 a third insulating layer; 5 a fourth insulating layer; and 6 a wiring layer. A semiconductor layer exists on another cross sectional surface.

In the embodiment, the third insulating layer 4 is etched, thereby forming a concave portion. The second insulating layer 7 and the third insulating layer 4 are made of different materials, thereby allowing the second insulating layer 7 to function as a stopper upon etching of the third insulating layer 4. Specifically, it is sufficient to use a film of the $SiO_2$ system as a material of the third insulating layer 4 and to use a film of the SiN system as a material of the second insulating layer 7. It is sufficient to use the HF system as an etchant. It will be obviously understood that the etching method is not limited to the wet etching; a dry etching can be also performed.

The relation between a width Y of concave portion and a width X of wiring will now be described. As shown in FIGS. 2B and 2C, the values of X and Y are set so as to satisfy the following relation.

$Y > X$

A gap x between the concave portion and the wiring portion 6 is determined by a film forming condition of the fourth insulating layer 5 after completion of the wiring step and a precision of the gap x. By forming a film onto the height different portion by a CVD, a shape which extends in the lateral direction is obtained. By setting the gap amount x to a value that is about two times as large as the extent in the lateral direction, the almost flat insulating layer 5 can be formed on the wiring as shown at reference numeral 9 in FIG. 1. By setting the value of x to (x+Δx) in consideration of a variation amount Δx of x also, a flat layer can be stably formed. By the method shown in the embodiment, the flat layer can be easily realized.

EMBODIMENT 2

Figure 3:
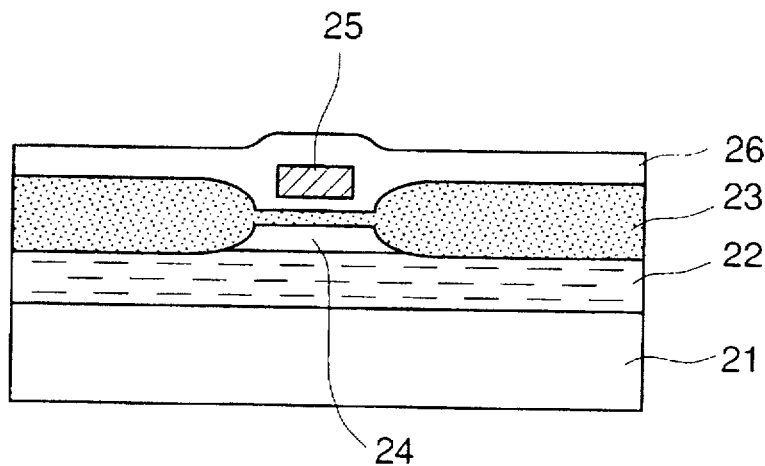
FIG. 3 is a cross sectional view showing a semiconductor device according to the second embodiment of the invention.

The second embodiment of the invention will now be described with reference to FIG. 3. In FIG. 3, reference numeral 21 denotes a substrate. For example, a semiconductor substrate made of Si, GaAs, or the like or an insulating substrate made by glass, sapphire, or the like is used as a substrate 21. Reference numeral 22 denotes an insulating layer formed on the substrate 21. For example, $SiO_2$, SiN, or an SiON film as a compound thereof, or the like is used as an insulating layer 22. Reference numeral 23 denotes a field oxide film; 24 a semiconductor layer made of Si or the like; 25 a wiring; and 26 an inter-layer insulating layer. Although not shown, a wiring layer of multi-layers can be also formed on the upper layer of the inter-layer insulating layer 26.

In the embodiment, a concave portion is formed by using the semiconductor layer 24. The concave portion can be formed by a selective oxidation process or the like such that a part of the semiconductor layer 24 is covered by, for example, an SiN film or the like and a region which is not covered is selectively oxidized by a heat and the field oxide film 23 is formed. As shown in FIG. 3, since the wiring 25 is formed over the semiconductor layer 24 as an active region, the upper portion of the wiring layer 25 is not projected and a flat surface can be realized by the inter-layer insulating layier 26. By floating the potential of the semiconductor layer 24, a parasitic capacitance is not caused between the wiring layer 25 and the semiconductor layer 24, and a wiring of a low capacitance can be realized.

EMBODIMENT 3

Figure 4:
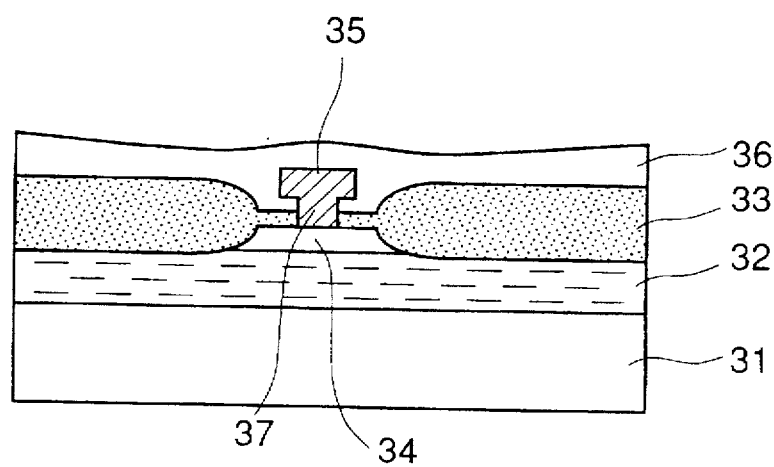
FIG. 4 is a cross sectional view showing a semiconductor device of the third embodiment of the invention.

The third embodiment of the invention will now be described with reference to FIG. 4. In a manner similar to the second embodiment, reference numeral 31 denotes a substrate; 32 an insulating layer; 33 a field oxide film; 34 a semiconductor layer; 35 a wiring; 36 an inter-layer insulating layer or upper portion insulating layer; and 37 a contact between the semiconductor layer 34 and the wiring 35.

In the embodiment, a concave portion is formed by using the semiconductor layer 34 in a manner similar to the second embodiment. It is a feature of the third embodiment that a part of the upper wiring 35 is come into contact with the lower semiconductor layer 34 and that the lower semiconductor layer 34 is also used as a wiring. With such a construction, there are effects such that not only the upper surface is flattened but also the wiring resistance is reduced and a redundancy of the wiring 35 also increases and yield rises. In case of cross wiring by using the same wiring material with the above structure, although a poly Si wiring is generally used, by using the method of the embodiment, it is possible to jump by a mono-crystalline layer and a flat cross wiring can be performed with a low resistance without increasing the wiring layer than the ordinary one.

It will be obviously understood that in order to realize an enough contact 37 with the upper wiring 35, a desired impurity must have been doped into the lower semiconductor layer 34.

Wirings in which the wiring 25 on a floating region semiconductor layer in the second embodiment and the wiring 35 which is in contact with the lower semiconductor layer 34 of the third embodiment mixedly exist are also effective. In this case, it is sufficient that the semiconductor layers are separated by an insulating layer.

EMBODIMENT 4

Figure 5:
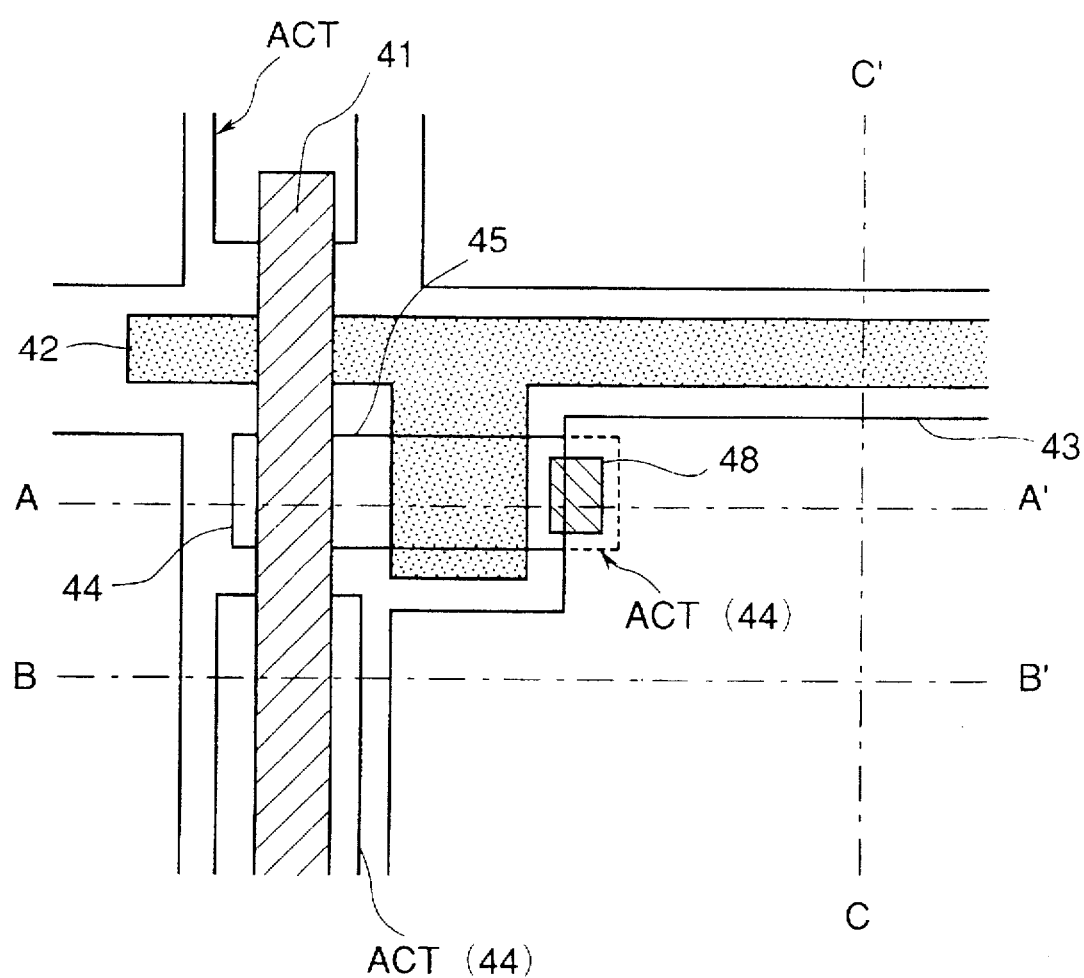
FIG. 5 is a plan view showing an array substrate of a liquid crystal display apparatus of the fourth embodiment of the invention.
Figure 6A:
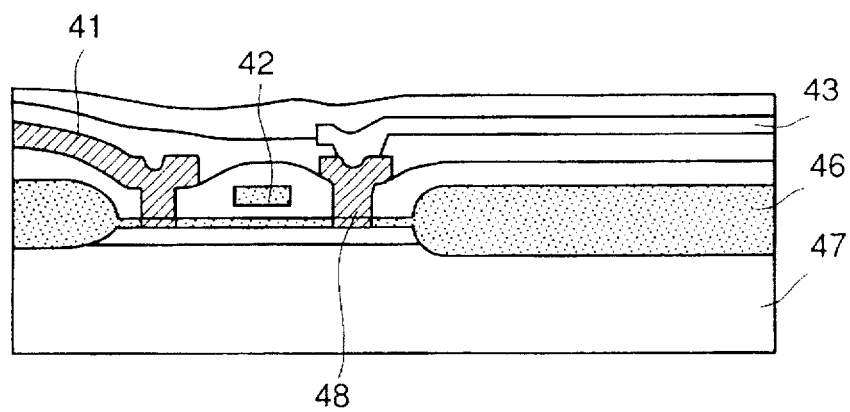
FIGS. 6A to 6C are cross sectional views of FIG. 5.
Figure 6B:
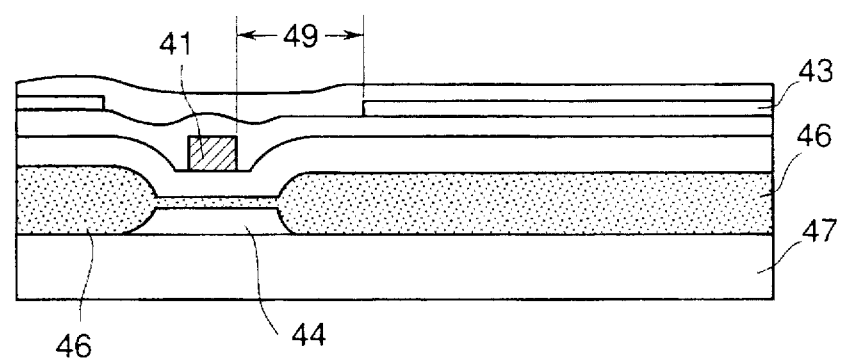
Figure 6C:
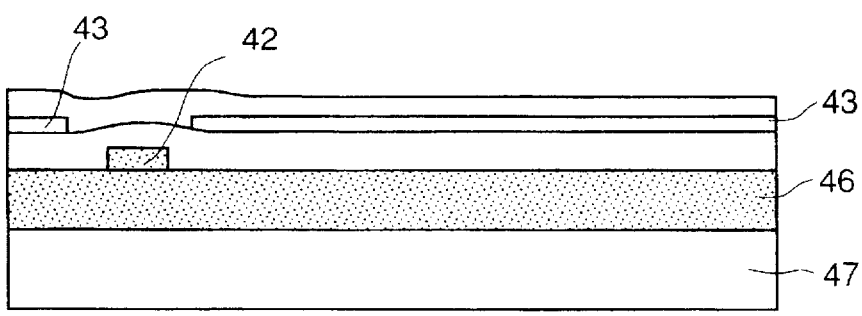

FIG. 5 is a plan view of an array substrate of a liquid crystal display apparatus of the fourth embodiment. FIGS. 6A to 6C are cross sectional views of FIG. 5. FIG. 6A is a cross sectional view taken along the line A–A' in FIG. 5, FIG. 6B is a cross sectional view taken along the line B–B', and FIG. 6C is a cross sectional view taken along the line C–C'. In FIGS. 5 and 6A to 6C, reference numeral 41 denotes a data line; 42 an address line; 43 a pixel electrode; 44 an active layer; 46 a field oxide film; 47 a transparent substrate; and 48 an electrode for connecting a drain of a TFT and the pixel electrode 43.

In the embodiment, the active layer 44 is used and a concave portion is provided below the data line 41. As will be obviously understood from FIG. 6B, in case of the conventional method, since the data line 41 is located at the highest position in the above cross sectional structure, a fairly large margin until the flat region is needed and an effective opening ratio decreases. However, as shown at reference numeral 49, the upper portion of the wiring layer of the data line 41 is flattened and the margin can be fairly narrowed than that of the conventional method. Due to this, it will be understood that not only the effective opening ratio increases and the bright display can be realized but also the power of the illuminating system can be suppressed and a burning phenomenon of the liquid crystal display due to an increase in temperature is suppressed.

In the embodiment, although the data line 41 over the active layer 44 is separated by the insulating layer, as shown in the third embodiment, it will be also obviously understood that it is also effective to use means such that the data line comes into contact with the lower semiconductor layer and a redundancy of the wiring increases and the resistance is reduced.

EMBODIMENT 5

Figure 7:
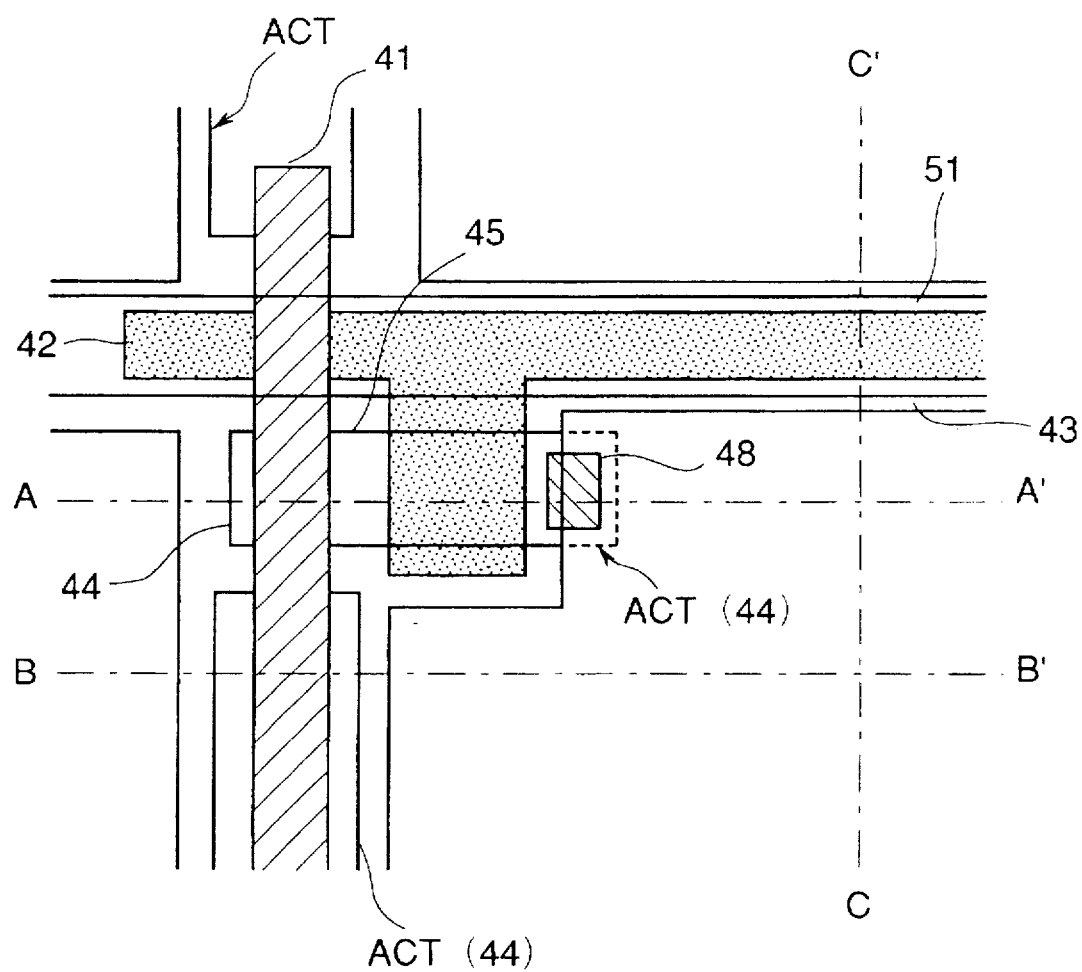
FIG. 7 is a plan view showing an array substrate of a liquid crystal display apparatus of the fifth embodiment of the invention.
Figure 8A:
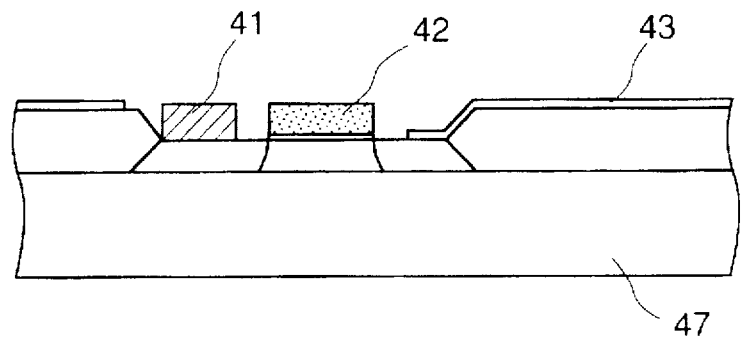
FIGS. 8A to 8C are cross sectional views of FIG. 7.
Figure 8B:
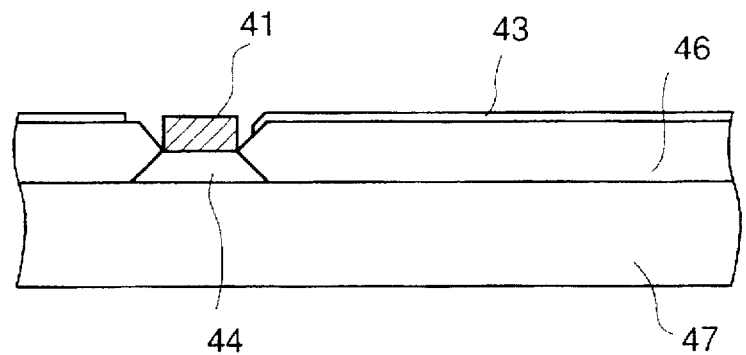
Figure 8C:
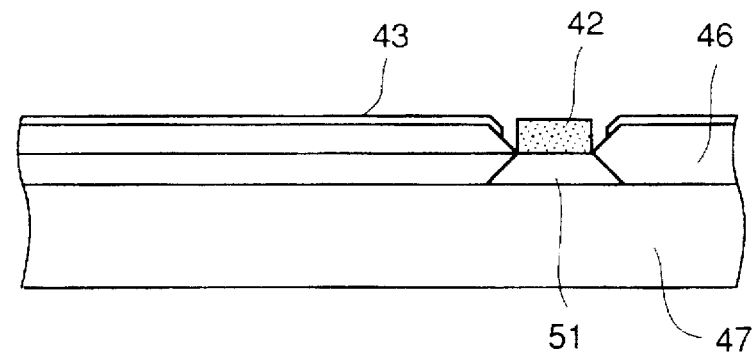

The fifth embodiment will now be described with reference to FIGS. 7 and 8A to 8C. FIGS. 8A to 8C are cross sectional views of FIG. 7. FIG. 8A is a cross sectional view taken along the line A–A' in FIG. 7, FIG. 8B is a cross sectional view taken along the line B–B', and FIG. 8C is a cross sectional view taken along the line C–C'. In FIGS. 7 and 8A to 8C, reference numeral 51 denotes an active layer and portions similar to those in the fourth embodiment are designated by the same reference numerals and their descriptions are omitted here.

In the embodiment, the active layers 44 and 51 are used and concave portions are formed under the data line 41 and address line 42. As will be understood from FIGS. 7 and 8A to 8C, the embodiment has the following features.

(1) The address line 42 is also buried into the concave portion on the active layer 51 and the upper surface is further flattened than that near the address line 42.

In the example shown in FIG. 7, the active layers are used as concave portions and those active layers 44, 51, and the like are mutually electrically isolated by the insulating layers.

(2) The wiring layers (data line 41, address line 42, and the like) are provided for the active layers 44 and 51 directly or through the thin insulating layer and a further flatness is accomplished. In this instance, a device in which the wiring which is in contact with the lower semiconductor layer and the floating lower semiconductor layer mixedly exist in a manner similar to the first and third embodiments is also effective.

EMBODIMENT 6

Figure 9:
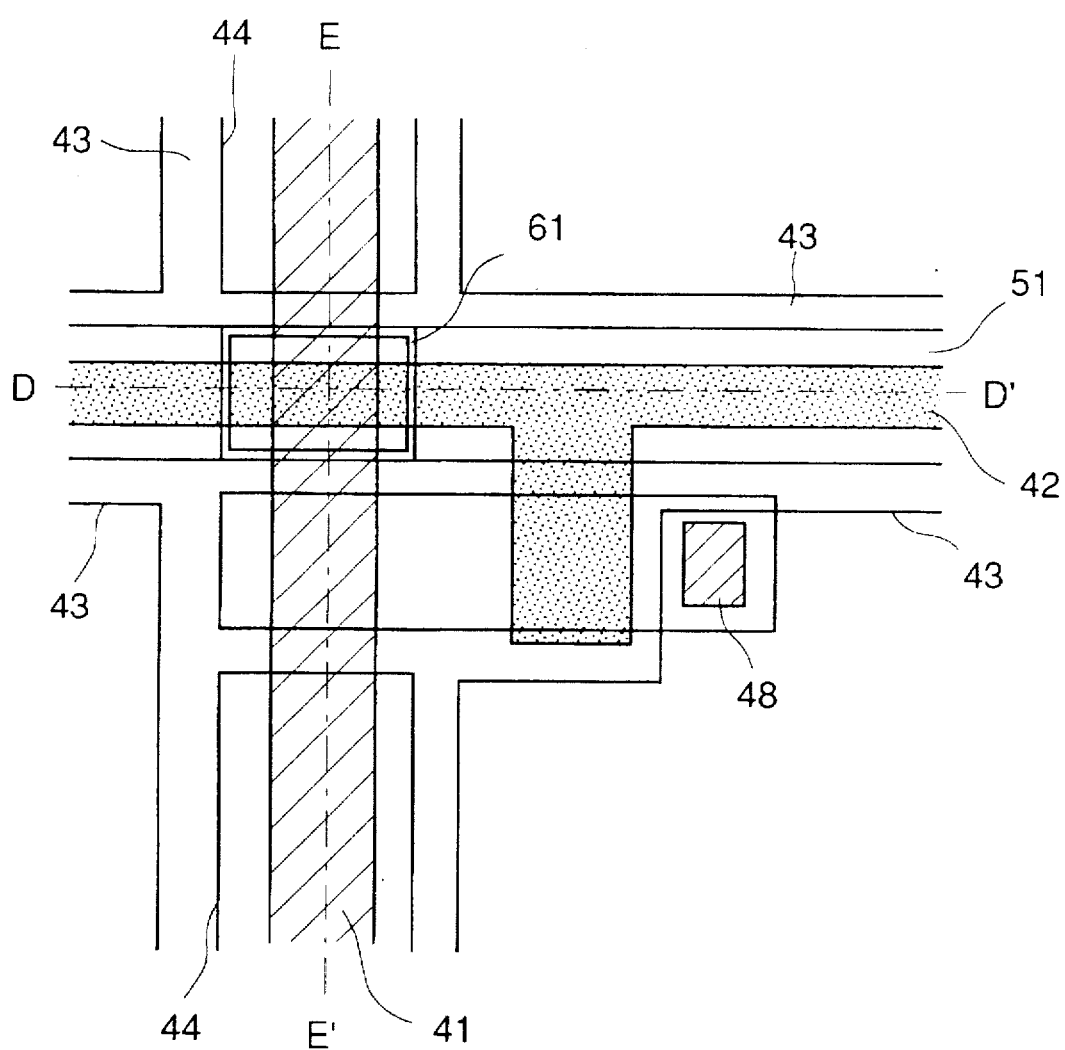
FIG. 9 is a plan view showing an array substrate of a liquid crystal display apparatus of the sixth embodiment of the invention.
Figure 10A:
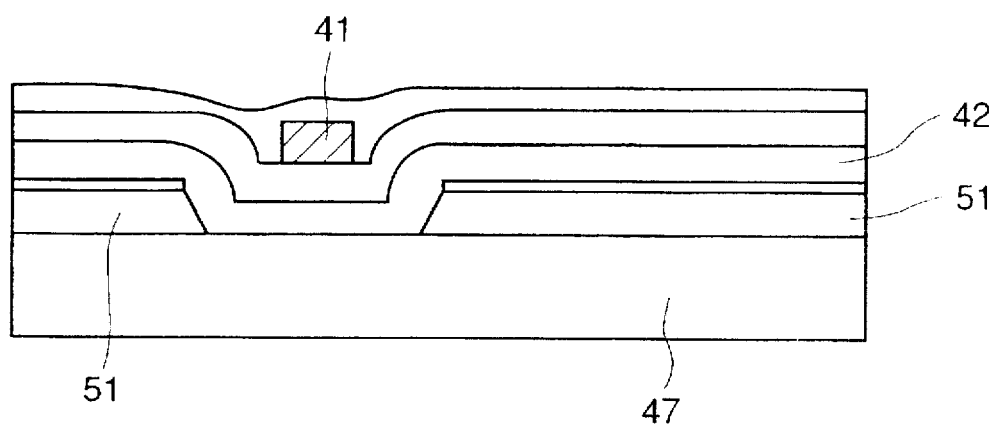
FIGS. 10A and 10B are cross sectional views of FIG. 9.
Figure 10B:
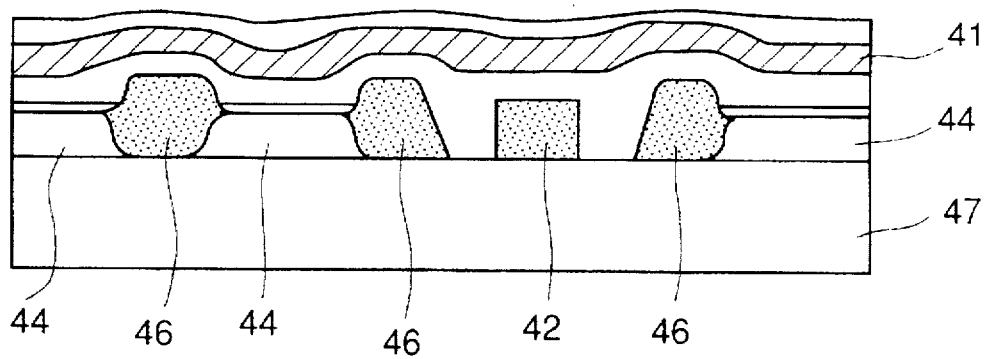
Figure 11:
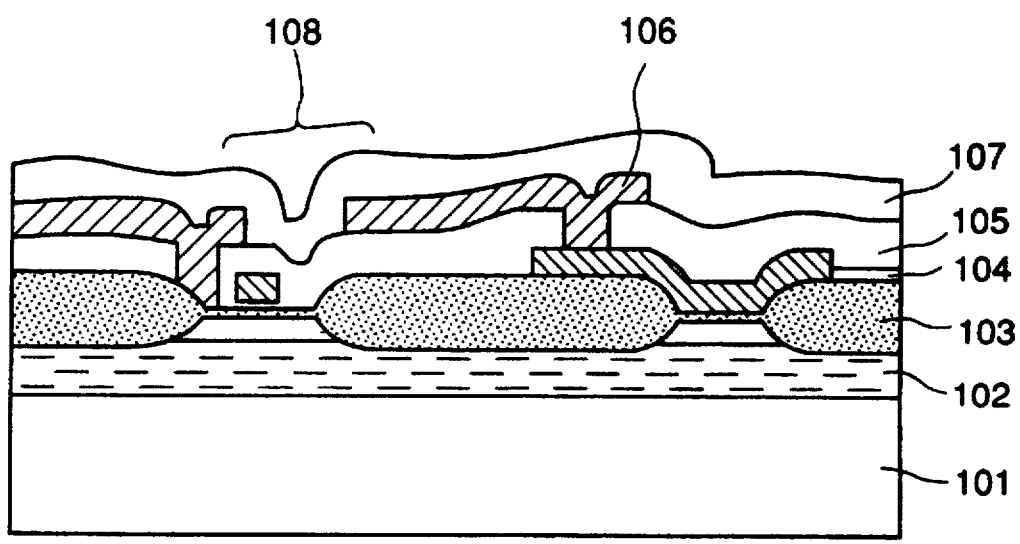
FIG. 11 is a cross sectional view showing a conventional semiconductor device.
Figure 12:
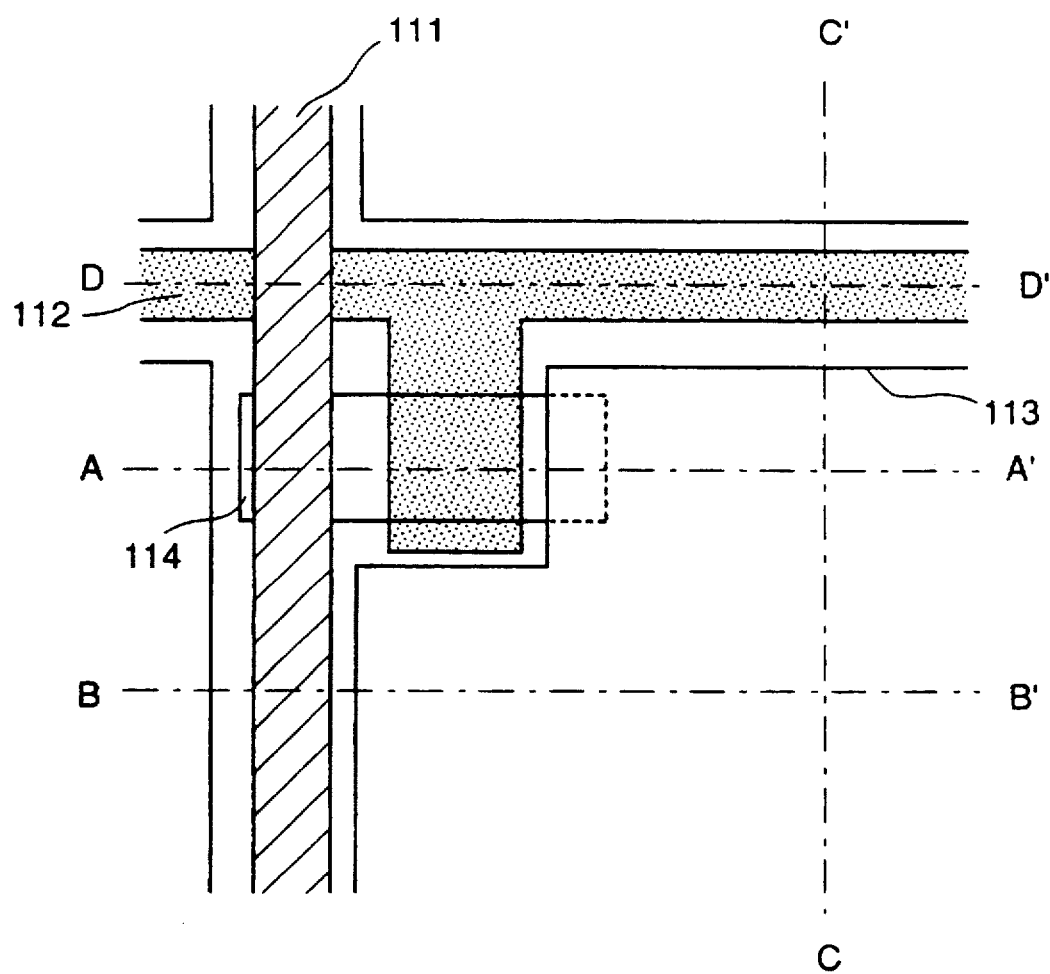
FIG. 12 is a plan view showing an array substrate of a conventional liquid crystal display apparatus.
Figure 13A:
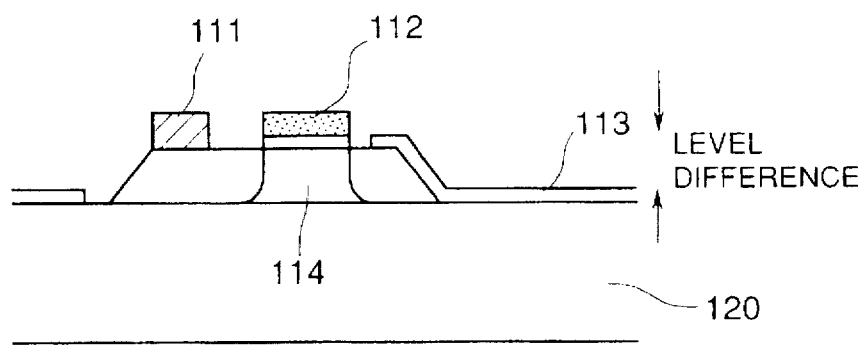
FIGS. 13A to 13D are cross sectional views of FIG. 12.
Figure 13B:
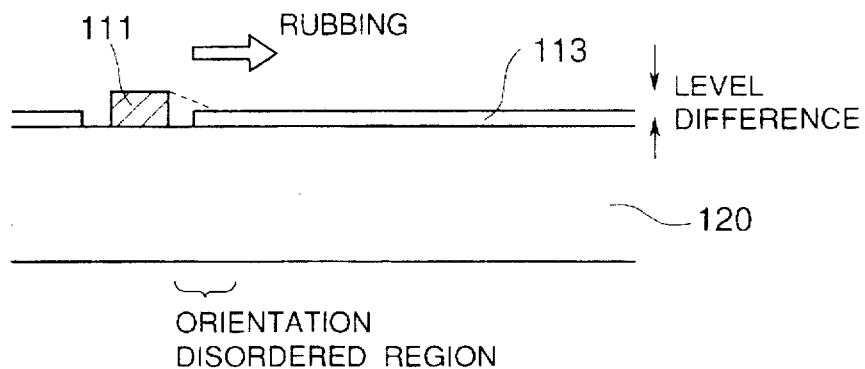
Figure 13C:
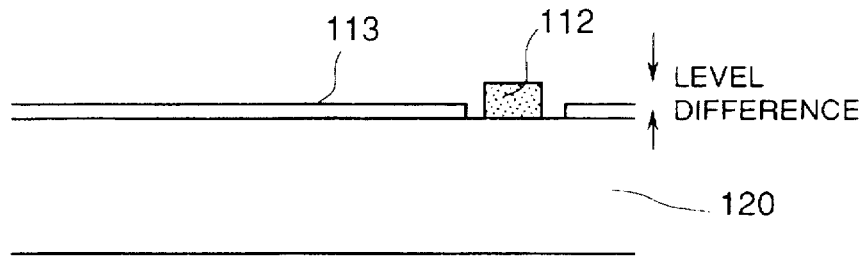
Figure 13D:
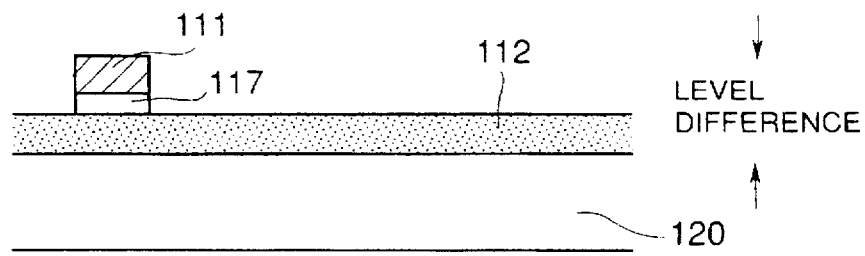

The sixth embodiment will now be described with reference to FIGS. 9, 10A and 10B. FIGS. 10A and 10B are cross sectional views of FIG. 9. FIG. 10A is a cross sectional view taken along the line D–D' in FIG. 9 and FIG. 10B is a cross sectional view taken along the line E–E'. In FIGS. 9, 10A and 10B reference numeral 61 denotes a concave portion of the region in which the data line 41 and the address line 42 intersect. The other portions similar to those in the fourth and fifth embodiments are designated by the same reference numerals and their descriptions are omitted.

It is a feature of the embodiment that a region of a different depth of the concave portion is formed at least two locations, thereby further flattening. Reference numeral 61 denotes a depth of concave portion of the region in which the data line 41 and the address line 42 intersect is larger than the depths of the concave portions 44 and 51. Hitherto, when the data line 41 and the address line 42 intersect, such an intersection portion is most highest and orientation characteristics of the liquid crystal are disordered. However, by using the structure of the method of the embodiment, an almost flat structure can be realized.

As a method of forming the concave portions of different depths, there is a method whereby an active layer region is used as a shallow concave portion and the semiconductor layer is etched as a deep concave portion and the lower insulating substrate exposing region is used. It will be obviously understood that the invention is not limited to such a method but a method of changing the depth by performing the etching process a plurality of number of times can be also used and that by partially arranging the etching stop layers, the concave portions of different depths can be formed.

As described above, according to the invention, a semiconductor device of flat surface can be obtained without performing any special flattening process and it is possible to prevent enlargement of the chip size, increase in costs, disconnection, and defective wiring pattern.

Further, by using the array substrate on which the semiconductor device is formed, it is possible to realized liquid crystal display apparatus in which the orientation variation upon rubbing decreases, so that a white blank degree of the pixel portion is small and a high contrast ratio is obtained.

What is claimed is:

1. A liquid crystal display device comprising:

an insulating substrate;

a semiconductor layer provided on a portion on said insulating substrate;

an insulating layer provided on said insulating substrate and said semiconductor layer, wherein said insulating layer is formed by oxidizing said semiconductor layer, and said insulating layer has a thickness at a region on said semiconductor layer thinner than the thickness of the insulating layer at another region, and has a concave section on said semiconductor layer;

a plurality of address lines provided on said insulating layer;

a data line arranged to cross said plurality of address lines on said insulating layer;

a plurality of switching elements arranged in a matrix configuration and connected to said data line;

a plurality of pixel electrodes arranged in a matrix configuration and connected to said plurality of switching elements;

an opposite substrate having a transparent electrode spaced from said insulating substrate; and a liquid crystal sandwiching between said insulating substrate and said opposite substrate, wherein at least one of said plurality of address lines and said data line are formed on the concave section of said insulating layer, and a potential of said semiconductor layer under the concave section is at a floating state.

2. A device according to claim 1, wherein a width of the concave section of said insulating layer is broader than the width of said plurality of address lines and said data line formed on the concave section.

3. A device according to claim 1, wherein a height of a step of said insulating layer at the concave section approximately equals a thickness of said plurality of address lines and said data line formed on the concave section.

4. A device according to claim 1, wherein said insulating substrate comprises a substrate and an insulating layer formed on said substrate.

5. A device according to claim 1, wherein said insulating substrate comprises a transparent substrate.

* * * * *

UNITED STATES PATENT AND TRADEMARK OFFICE
CERTIFICATE OF CORRECTION

PATENT NO. : 5,783,842
DATED : July 21, 1998
INVENTOR(S) : TETSUNOBU KOHCHI, ET AL.

It is certified that error appears in the above-identified patent and that said Letters Patent is hereby corrected as shown below:

COLUMN 5

```
Line 2,  "is come" should read --comes--;
Line 13, "than" should read --more than--;
Line 14, "an" should be deleted;
Line 46, "narrowed" should read --narrower--.
```

UNITED STATES PATENT AND TRADEMARK OFFICE
CERTIFICATE OF CORRECTION

PATENT NO. : 5,783,842
DATED      : July 21, 1998
INVENTOR(S) : TETSUNOBU KOHCHI, ET AL.

It is certified that error appears in the above-identified patent and that said Letters Patent is hereby corrected as shown below:

<u>COLUMN 6</u>

Line 38, "at" should read --in at--;
Line 44, "most" should be deleted.

Signed and Sealed this

Twenty-fourth Day of August, 1999

Attest:

Q. TODD DICKINSON

*Attesting Officer*     *Acting Commissioner of Patents and Trademarks*